(12) United States Patent
Hwang et al.

(10) Patent No.: US 8,796,122 B2
(45) Date of Patent: Aug. 5, 2014

(54) METHOD OF FABRICATING DISPLAY DEVICE HAVING A PIXEL REGION AND A CIRCUIT REGION OVER THE SAME SUBSTRATE

(75) Inventors: Eui-Hoon Hwang, Yongin-si (KR); Deuk-Jong Kim, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 1443 days.

(21) Appl. No.: 11/170,486

(22) Filed: Jun. 30, 2005

(65) Prior Publication Data

US 2006/0003505 A1 Jan. 5, 2006

(30) Foreign Application Priority Data

Jun. 30, 2004 (KR) .................. 10-2004-0050873

(51) Int. Cl.
*H01L 21/26* (2006.01)

(52) U.S. Cl.
USPC .............. 438/513; 438/149; 438/150; 257/64

(58) Field of Classification Search
USPC ........................................ 438/308
See application file for complete search history.

(56) References Cited

U.S. PATENT DOCUMENTS

| | | | |
|---|---|---|---|
| 5,476,691 A * | 12/1995 | Komvopoulos et al. | 427/527 |
| 6,157,421 A * | 12/2000 | Ishii | 349/43 |
| 6,169,041 B1 * | 1/2001 | Liu et al. | 438/778 |
| 6,274,512 B1 * | 8/2001 | Hayashi et al. | 438/766 |
| 6,576,924 B1 * | 6/2003 | Yamazaki et al. | 257/59 |
| 6,674,136 B1 * | 1/2004 | Ohtani | 257/408 |
| 6,793,980 B2 * | 9/2004 | Ohtsu et al. | 427/558 |
| 7,227,181 B2 * | 6/2007 | Hwang | 257/40 |
| 2001/0018238 A1 * | 8/2001 | Kim | 438/145 |
| 2003/0164501 A1 | 9/2003 | Suzuki et al. | |
| 2004/0063270 A1 * | 4/2004 | Ishikawa | 438/222 |

FOREIGN PATENT DOCUMENTS

| | | | |
|---|---|---|---|
| CN | 1397822 | | 2/2003 |
| JP | 08-160466 | | 6/1996 |
| JP | 2002-231955 | | 8/2002 |
| KR | 1020040054433 | * | 6/2004 |
| WO | 98-36406 | | 8/1998 |
| WO | 03/085448 | | 10/2003 |

OTHER PUBLICATIONS

Dendy, Richard "Plasma Physics: An Introductroy course", Cambridge University Press 1993; pp. 340, 438.*
NPL "Ion Implantation Process" http://www.p2pays.org/ref/38/37020.htm, pp. 1.*
Wikipedia "Plasma (physics)" http://en.wikipedia.org/wiki/Plasma (physics), pp. 1.*

* cited by examiner

*Primary Examiner* — Eva Yan Montalvo
(74) *Attorney, Agent, or Firm* — H.C. Park & Associates, PLC

(57) ABSTRACT

A method of fabricating a display device is provided. The method includes providing a substrate having a pixel region and a circuit region located at the periphery of the pixel region. A first semiconductor layer and a second semiconductor layer are formed on the pixel region and on the circuit region, respectively. The first semiconductor layer may be selectively surface treated to increase the density of lattice defects in a surface of the first semiconductor layer.

15 Claims, 3 Drawing Sheets

METHOD OF FABRICATING DISPLAY DEVICE HAVING A PIXEL REGION AND A CIRCUIT REGION OVER THE SAME SUBSTRATE

CROSS-REFERENCE TO RELATED APPLICATIONS

This application claims priority to and the benefit of Korean Patent Application No. 2004-50873, filed Jun. 30, 2004, the disclosure of which is incorporated herein by reference in its entirety.

BACKGROUND OF THE INVENTION

1. Field of the Invention

The present invention relates to a method of fabricating a display device and, more particularly, to a method of fabricating a display device having a thin film transistor (TFT).

2. Description of the Related Art

A flat panel device in which each unit pixel has a unit pixel driving circuit is referred to as an active matrix display device. The unit pixel driving circuit includes at least one thin film transistor (TFT) to control current or voltage applied to a pixel electrode.

The TFT includes a semiconductor layer, a gate electrode and source and drain electrodes, and is classified according to a type of the semiconductor layer. Specifically, the TFT is referred to as a polysilicon TFT when the semiconductor layer is formed of a polysilicon layer, and referred to as an amorphous silicon TFT when the semiconductor layer is formed of an amorphous silicon layer. For the polysilicon TFT, carrier mobility in a channel region is higher than that for the amorphous silicon TFT, so that a display device having a high resolution may be implemented. In addition, the high carrier mobility of the polysilicon TFT enables a pixel portion as well as a circuit portion for driving the pixel portion to be simultaneously formed on the substrate of the display device. As described above, when a display device includes a pixel portion and a circuit portion on the same substrate, a thin film transistor in the pixel portion and a thin film transistor in the circuit portion may have different specifications from each other. However, it is challenging to form the pixel TFT and the circuit TFT to have different electrical characteristics from each other on the same substrate.

SUMMARY OF THE INVENTION

The present invention, therefore, solves aforementioned problems associated with conventional devices by providing a method of fabricating a display device capable of forming a pixel TFT and a circuit TFT, which have different electrical characteristics, on one substrate.

In an exemplary embodiment of the present invention, a method of fabricating a display device is provided. The method includes providing a substrate having a pixel region and a circuit region located at the periphery of the pixel region. A first semiconductor layer and a second semiconductor layer may be formed on the pixel region and on the circuit region, respectively. The first semiconductor layer may be selectively surface treated to be increased density of lattice defects of a surface of the first semiconductor layer.

The surface treatment of the first semiconductor layer may be performed with plasma. The plasma may contain at least one material selected from a group consisting of $O_2$, $N_2O$, $H_2$ and inert gas.

The selective surface treatment of the first semiconductor layer may include: forming a mask pattern on the second semiconductor layer to expose the first semiconductor layer; and performing surface treatment on the exposed first semiconductor layer with the plasma. The mask pattern may be a photoresist pattern.

The method may further include: forming a gate insulating layer on the surface-treated first semiconductor layer and on the second semiconductor layer; and forming a first gate electrode and a second gate electrode on the gate insulating layer, the first and second gate electrodes overlapping the first semiconductor layer and the second semiconductor layer, respectively.

In addition, the method may further include: forming a first drain electrode coupled to the first semiconductor layer; and forming a pixel electrode coupled to the first drain electrode. Here, the method may further include: forming an organic functional layer having at least an emission layer on the pixel electrode; and forming a counter electrode on the organic functional layer.

In another exemplary embodiment of the present invention, a method of fabricating a display device is provided. The method includes providing a substrate having a pixel region and a circuit region located at the periphery of the pixel region. A first semiconductor layer and a second semiconductor layer may be formed on the pixel region and on the circuit region, respectively. The first semiconductor layer may be selectively surface treated with inert gas plasma.

BRIEF DESCRIPTION OF THE DRAWINGS

The above and other features of the present invention will be described in reference to certain exemplary embodiments thereof with reference to the attached drawings.

DETAILED DESCRIPTION OF THE INVENTION

Figure 1A:
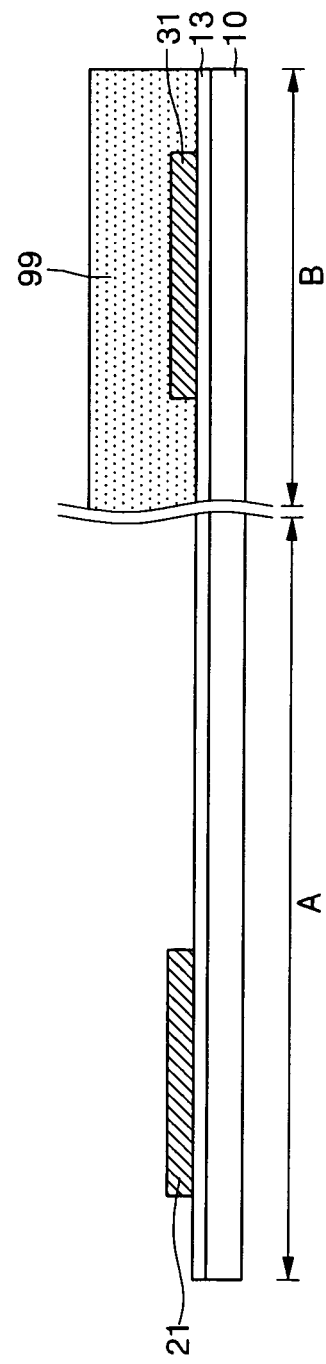
FIGS. 1A, 1B, and 1C are cross-sectional views showing a method of fabricating a display device according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 1B:
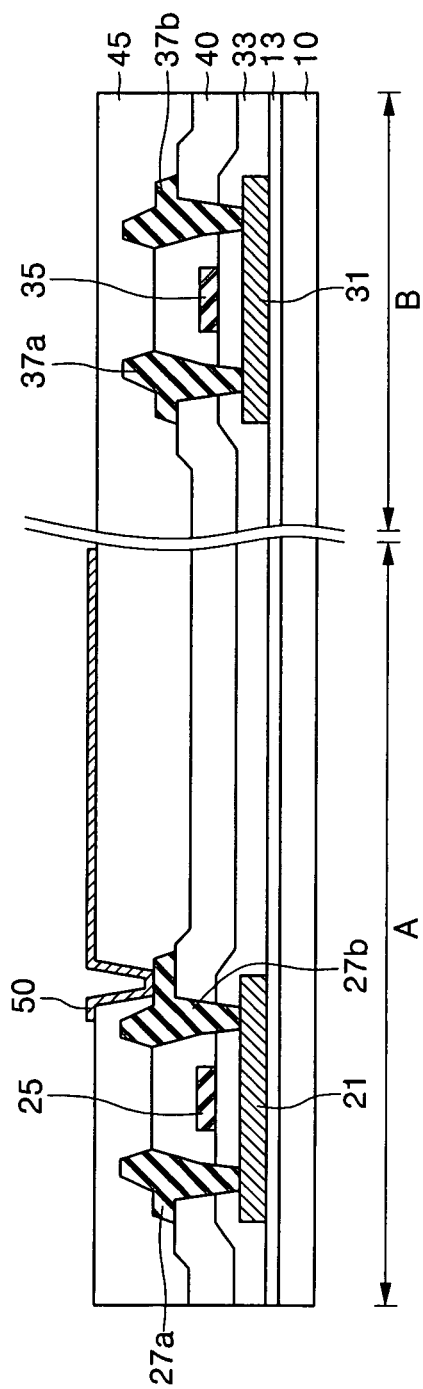
Figure 1C:
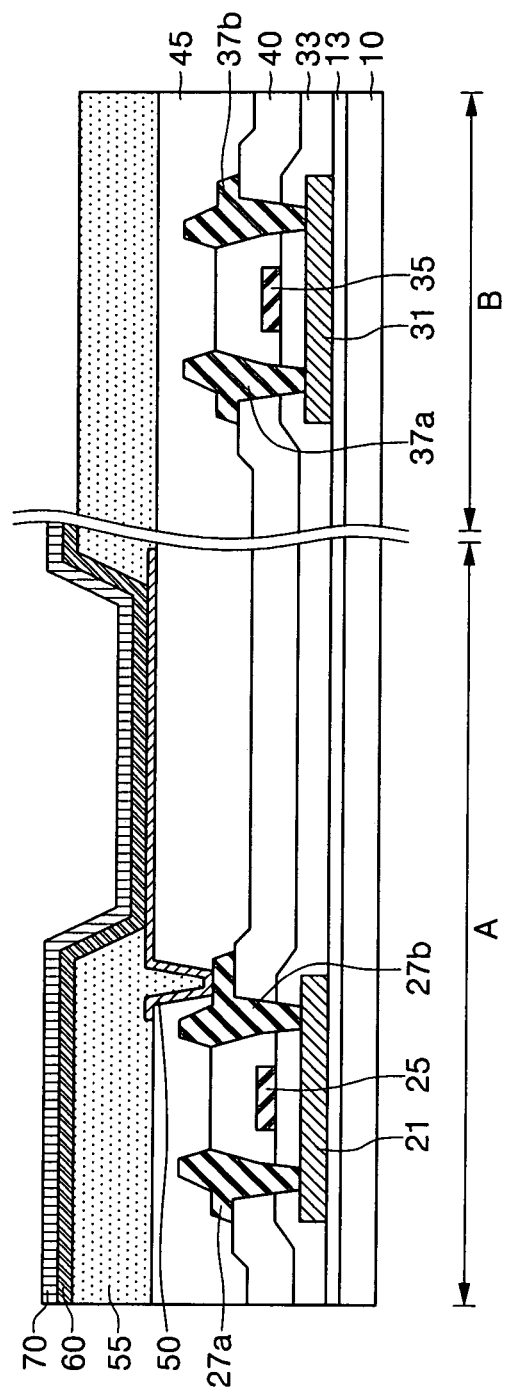

FIGS. 1A, 1B and 1C are cross-sectional views showing a method of fabricating a display device according to an embodiment of the present invention.

Referring to FIG. 1A, a substrate 10 having a pixel region A and a circuit region B located at the periphery of the pixel region A is provided. The pixel region A is a region where images are displayed. In the figure, a unit pixel is shown as the pixel region. The circuit region B, which is a region where circuits for driving and controlling the images displayed on the pixel region A are formed, is shown herein as one thin film transistor. Further, the substrate 10 may be made of glass, quartz, sapphire, single crystal silicon, or plastic.

A buffer layer 13 may be formed on the substrate 10. The buffer layer 13 may be made of a silicon oxide layer, a silicon nitride layer, a silicon oxynitride layer, or a stacked layer thereof.

An amorphous silicon layer may be deposited on the buffer layer 13. A polysilicon layer may be formed by crystallizing the amorphous silicon layer using a solid phase crystallization (SPC) method, an excimer laser annealing (ELA) method, a sequential lateral solidification (SLS) method, or a metal induced crystallization (MIC) method. By patterning the polysilicon layer, a first semiconductor layer 21 and a second semiconductor layer 31 may be formed on the pixel region A and on the circuit region B, respectively.

Next, the first semiconductor layer 21 may be selectively surface-treated to increase the density of lattice defects of a surface of the first semiconductor layer 21. The surface treatment of the first semiconductor layer 21 may be performed with plasma. The plasma may contain at least one material selected from a group consisting of $O_2$, $N_2O$, $H_2$, and inert gas. The inert gas may be $N_2$ or element of group 18 in the periodic table. The element of group 18 may be He or Ar. Particles accelerated in the plasma may physically collide with the surface of the first semiconductor layer 21 to increase the density of the lattice defects of the surface of the first semiconductor layer 21. Moreover, when reactive gas such as $O_2$, $N_2O$, or $H_2$ is contained in the plasma, an energy of the plasma may be controlled such that the physical collision prevails over the chemical reaction while performing the surface treatment on the first semiconductor layer 21.

Specifically, selectively performing the surface treatment on the first semiconductor layer 21 includes forming a mask pattern 99 on the second semiconductor layer 31 to expose the first semiconductor layer 21, and performing the surface treatment on the exposed first semiconductor layer 21 with plasma. The mask pattern 99 may be a photoresist pattern.

Referring to FIG. 1B, the mask pattern (99 in FIG. 1a) is removed to expose the second semiconductor layer 31. A gate insulating layer 33 is formed on the exposed second semiconductor layer 31 and on the surface-treated first semiconductor layer 21. The gate insulating layer 33 may be formed by a physical vapor deposition (PVD) method or a chemical vapor deposition (CVD) method. The gate insulating layer 33 may be formed along the surface of the semiconductor layers 21 and 31, and an interface between the gate insulating layer 33 and the first semiconductor layer 21 may have poor electrical characteristics compared to an interface between the gate insulating layer 33 and the second semiconductor layer 31. The difference in electrical characteristics results in part because the surface of the first semiconductor layer 21 is treated with inert gas plasma and the surface of the second semiconductor layer 31 is not treated. In particular, the surface treatment of the first semiconductor layer 21 tends to increase the density of surface lattice defects in the first semiconductor layer 21. The gate insulating layer 33 may be formed using a LPCVD, APCVD, or PECVD method, or similar method known to a skilled artisan. The gate insulating layer 33 may be formed of a silicon oxide layer, a silicon nitride layer, a silicon oxynitride layer, or a stacked layer thereof. In addition, the gate insulating layer 33 may be formed to a thickness of about 800 Å to about 1500 Å.

A first gate electrode 25 and a second gate electrode 35 overlapping the first semiconductor layer 21 and the second semiconductor layer 31, respectively, may be formed by depositing a gate conductive layer on the gate insulating layer 33 and patterning the gate conductive layer. An interlayer insulating layer 40 may be formed on the gate electrodes 25 and 35. First contact holes exposing both ends of the first semiconductor layer 21 and second contact holes exposing both ends of the second semiconductor layer 31 may be formed in the interlayer insulating layer 40. Source and drain conductive layers may be deposited on the substrate where the contact holes are formed, and then the source and drain conductive layers may be patterned to form a first source electrode 27a and a first drain electrode 27b respectively connected to both ends of the first semiconductor layer 21 through the first contact holes, and a second source electrode 37a and a second drain electrode 37b respectively connected to both ends of the second semiconductor layer 31 through the second contact holes.

The first semiconductor layer 21, the first gate electrode 25, and the first source and drain electrodes 27a and 27b form a pixel TFT. Further, the second semiconductor layer 31, the second gate electrode 35, and the second source and drain electrodes 37a and 37b form a circuit TFT. The surface lattice defect of the first semiconductor layer 21 and a relatively rough interface between the first semiconductor layer 21 and the gate insulating layer 33 cause trap and scattering of charges when operating the pixel TFT. Therefore, an S-factor of the pixel TFT may be larger than that of the circuit TFT. Accordingly, when the pixel TFT having the large S-factor is a driving TFT coupled to an electroluminescent (EL) element of an electroluminescent display device, a gray-scale of the EL element may be readily controlled. However, since the circuit TFT is generally used as a switching TFT, its S-factor should be small. As a result, by selectively performing the surface treatment on the first semiconductor layer 21 to increase the density of lattice defects on the first semiconductor layer 21, a pixel TFT and a circuit TFT that have different electrical characteristics may be fabricated on one substrate.

A passivation insulating layer 45 may be formed on the source and drain electrodes 27a, 27b, 37a and 37b. A via hole exposing the first drain electrode 27b may be formed in the passivation insulating layer 45. A pixel conductive layer may be formed on the substrate where the via hole is formed, and the pixel conductive layer may be patterned to form a pixel electrode 50 electrically connected to the first drain electrode 27b on the passivation insulating layer 45 of the pixel region A through the via hole.

Referring to FIG. 1C, a pixel defining layer 55 having an opening that exposes at least a portion of the pixel electrode 50 may be formed on the pixel electrode 50. An organic functional layer 60 having at least an emission layer may be formed on the pixel electrode 50 exposed in the opening. A counter electrode 70 may be formed on the organic functional layer 60.

An exemplary example will now be described for thorough understanding of the present invention.

FABRICATION EXAMPLE 1 OF PIXEL AND CIRCUIT TFTS

An amorphous silicon layer was deposited on a substrate having a pixel region and a circuit region and the amorphous silicon layer was crystallized by an ELA method to form a polysilicon layer. The polysilicon layer was patterned to form a first semiconductor layer and a second semiconductor layer on the pixel region and the circuit region, respectively. A photoresist pattern was formed on the second semiconductor layer to expose the first semiconductor layer. The exposed first semiconductor layer is surface treated for 120 seconds under conditions of a pressure of 660 Pa, an RF power of 300 W, and amounts of 5000 sccm He and 100 sccm O2. The photoresist pattern was removed and a gate insulating layer was formed on the surface treated first semiconductor layer and the second semiconductor layer by a PECVD method. A conductive layer was deposited on the gate insulating layer and patterned, so that a first gate electrode and a second gate electrode respectively overlapping the first semiconductor layer and the second semiconductor layer were formed. An interlayer insulating layer was formed on the gate electrodes. Contact holes were formed in the interlayer insulating layer, and the conductive layer was deposited and patterned on the substrate where the contact holes were formed. Therefore, a first source electrode and a first drain electrode respectively connected to both ends of the first semiconductor layer, and a second source electrode and a second drain electrode respectively connected to both ends of the second semiconductor layer were formed. Thus, a pixel TFT having the first semiconductor layer, the first gate electrode and the first source and drain electrodes, and a circuit TFT having the second semiconductor layer, the second gate electrode and the second source and drain electrodes were fabricated.

FABRICATION EXAMPLE 2 OF PIXEL AND CIRCUIT TFTS

Except that a surface of a first semiconductor layer was treated for 120 seconds under conditions of a pressure of 660 Pa, an RF power of 700 W, and amounts of 5000 sccm He and 500 sccm O2, pixel and circuit TFTs of the Fabrication Example 2 were fabricated in the same manner as in the Fabrication Example 1.

COMPARATIVE EXAMPLE OF PIXEL AND CIRCUIT TFTS

Except that, after forming a first semiconductor layer and a second semiconductor layer, a gate insulating layer was formed on the first semiconductor layer and second semiconductor layer without performing surface treatment on the first semiconductor layer, pixel and circuit TFTs were fabricated in the same manner as in the fabrication example 1.

S-factors and standard deviations of the pixel and circuit TFTs according to the Fabrication Examples 1 and 2, and the Comparative Example were shown in Table 1.

TABLE 1

| | Pixel TFT | | Circuit TFT | |
| --- | --- | --- | --- | --- |
| | S factor (V/dec) | Standard Deviation | S factor (V/dec) | Standard Deviation |
| Fabrication Example 1 | 0.36 | 0.02 | 0.28 | 0.01 |
| Fabrication Example 2 | 0.44 | 0.02 | 0.28 | 0.01 |
| Comparative Example | 0.28 | 0.01 | 0.28 | 0.01 |

Referring to Table 1, it may be appreciated that the S factor of the pixel TFT is larger than that of the circuit TFT in the case where the semiconductor layer of the pixel TFT is selectively surface treated with the inert gas plasma. Therefore, the pixel TFT and the circuit TFT, which have different electrical characteristics, may be fabricated on one substrate.

As described above, according to the present invention, a pixel TFT and a circuit TFT, which have different electrical characteristics, may be formed on one substrate by selectively performing surface treatment on a semiconductor layer of the pixel TFT to increase density of lattice defects on the surface of the semiconductor layer of the pixel TFT.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating a display device, comprising:
    providing a substrate having a pixel region and a circuit region located at a periphery of the pixel region;
    forming a first semiconductor layer and a second semiconductor layer on the pixel region and on the circuit region, respectively; and
    performing a plasma surface treatment on the entire first semiconductor layer without performing the plasma surface treatment on the second semiconductor layer, wherein the plasma surface treatment increases a density of lattice defects of a surface of the first semiconductor layer.

2. The method of claim 1, wherein a plasma of the plasma surface treatment comprises at least one material selected from the group consisting of $O_2$, $N_2O$, $H_2$, and inert gas.

3. The method of claim 1, wherein performing the plasma surface treatment on the entire first semiconductor layer without performing the plasma surface treatment on the second semiconductor layer comprises:
    forming a mask pattern on the second semiconductor layer to expose a surface of the first semiconductor layer; and
    treating the exposed surface of the first semiconductor layer with the plasma.

4. The method of claim 3, wherein the mask pattern is a photoresist pattern.

5. The method of claim 1, further comprising:
    forming a gate insulating layer on the surface treated first semiconductor layer and on the second semiconductor layer; and
    forming a first gate electrode and a second gate electrode on the gate insulating layer, the first and second gate electrodes overlapping the first semiconductor layer and the second semiconductor layer, respectively.

6. The method of claim 1, further comprising:
    forming a first drain electrode coupled to the first semiconductor layer; and
    forming a pixel electrode coupled to the first drain electrode.

7. The method of claim 6, further comprising:
    forming an organic functional layer having at least an emission layer on the pixel electrode; and
    forming a counter electrode on the organic functional layer.

8. A method of fabricating a display device, comprising:
    providing a substrate having a pixel region and a circuit region located at a periphery of the pixel region;
    forming a first semiconductor layer and a second semiconductor layer on the pixel region and on the circuit region, respectively; and
    performing a plasma surface treatment on the entire first semiconductor layer without performing the plasma surface treatment on the second semiconductor layer with inert gas plasma, wherein the plasma surface treatment increases a density of lattice defects of a surface of the first semiconductor layer.

9. The method of claim 8, wherein performing the plasma surface treatment on the entire first semiconductor layer without performing the plasma surface treatment on the second semiconductor layer comprises:
    forming a mask pattern on the second semiconductor layer to expose the first semiconductor layer; and
    performing the plasma surface treatment on the exposed first semiconductor layer with the inert gas plasma.

10. The method of claim 9, wherein the mask pattern is a photoresist pattern.

11. The method of claim 8, wherein the inert gas comprises at least one material selected from the group consisting of $N_2$, He, and Ar.

12. The method of claim 8, further comprising:
    forming a gate insulating layer on the plasma surface treated first semiconductor layer and on the second semiconductor layer; and
    forming a first gate electrode and a second gate electrode on the gate insulating layer, the first and second gate electrodes overlapping the first semiconductor layer and the second semiconductor layer, respectively.

13. The method of claim 8, further comprising:
    forming a first drain electrode coupled to the first semiconductor layer; and
    forming a pixel electrode coupled to the first drain electrode.

14. The method of claim 13, further comprising:
    forming an organic functional layer having at least an emission layer on the pixel electrode; and
    forming a counter electrode on the organic functional layer.

15. A method of fabricating a display device, comprising:
    providing a substrate having a pixel region and a circuit region located at a periphery of the pixel region;
    forming a first semiconductor layer and a second semiconductor layer on the pixel region and on the circuit region, respectively; and
    performing a plasma surface treatment on only the entire first semiconductor layer to increase density of lattice defects of a surface of the first semiconductor layer.

\* \* \* \* \*